(12) United States Patent
Benz et al.

(10) Patent No.: US 6,420,646 B2
(45) Date of Patent: Jul. 16, 2002

(54) PHOTOVOLTAIC ELEMENT

(75) Inventors: Volker Benz, Hoeschst; Michael Blumenschein, Bensheim; Markus Krall, Woerth, all of (DE)

(73) Assignee: Roehm GmbH & Co. KG, Darmstadt (DE)

( * ) Notice: Subject to any disclaimer, the term of this patent is extended or adjusted under 35 U.S.C. 154(b) by 0 days.

(21) Appl. No.: 09/780,494

(22) Filed: Feb. 12, 2001

(30) Foreign Application Priority Data

Feb. 17, 2000 (DE) ..................................... 200 02 827 U

(51) Int. Cl.⁷ ............................................ H01L 31/048
(52) U.S. Cl. .................... 136/251; 257/433; 438/66; 438/67
(58) Field of Search ................... 136/251; 257/433; 438/66, 67

(56) References Cited

U.S. PATENT DOCUMENTS 5,972,732 A * 10/1999 Gee et al. .................... 438/66
6,262,358 B1 * 7/2001 Kamimura et al. ......... 136/244

FOREIGN PATENT DOCUMENTS

| DE | 3801989 A1 | * | 7/1989 |
| JP | 10-1334 A | * | 1/1998 |
| JP | 10-299353 A | * | 11/1998 |
| WO | WO 96/18212 A1 | * | 6/1996 |
| WO | WO 00/46860 A1 | * | 8/2000 |

* cited by examiner

*Primary Examiner*—Alan Diamond
(74) *Attorney, Agent, or Firm*—Oblon, Spivak, McClelland, Maier & Neustadt, P.C.

(57) ABSTRACT

A photovoltaic element having two plane or curved plates (1) and (2), which are joined by a circumferential seal (3) at a spacing ranging from 2 to 20 mm, thus forming a cavity (4) in which there are enclosed a plurality of photovoltaic cells (5), each of which is attached to only one of the two plates (2) using an adhesive (6), at least this plate (2) being transparent, wherein both plates are made of plastic that is permeable to water vapor and the adhesive with which the photovoltaic cells are attached covers at most 30% of the area of the individual photovoltaic cells can be used for applications such as roofing and illuminating bus stops.

54 Claims, 2 Drawing Sheets

PHOTOVOLTAIC ELEMENT

BACKGROUND OF THE INVENTION

1. Field of the Invention

The invention relates to a photovoltaic element in which a plurality of photovoltaic cells are enclosed between two plastic plates.

2. Discussion of the Background

Photovoltaic elements containing photovoltaic cells embedded in plastic between transparent panes are generally known. These elements are used for applications such as roofing and illuminating bus stops.

German Patent Application 4443317 describes a photovoltaic element in which a plurality of photovoltaic cells are embedded in an elastic plastic material between two polymethyl methacrylate plates. The photovoltaic cells are protected against ingress of water and against mechanical influences, such as impacts.

German Patent Application 3801989 describes a cladding panel of insulating glass in which photovoltaic solar generators in the air space between two glass panes are attached to one of the panes using an elastic plastic. Thereafter the solar generator is encapsulated with hot-melt adhesive or enveloped with sheeting.

Adhesives for methyl methacrylate plastics are known. The adhesive bonding of polymethyl methacrylate parts by means of nitroethane or nitromethane is known from German Unexamined Application (DE-OS) 2737270. Polymerization adhesives that are based on polymethyl methacrylate or methyl methacrylate and that can be cured by means of UV or visible light are described in, for example, European Patent Applications 436205 or 548740. The use of lower alkyl formates in volatile adhesives or adhesive lacquers based on polymethyl methacrylate is known from European Patent Application 663419. An advantageous adhesive bonding technique for polymethyl methacrylate parts using solvent adhesives in combination with viscous polymerization adhesives is described in European Patent Application 675184.

Photovoltaic elements as described in German Patent Application 3801989 or 4443317 offer good protection to the photovoltaic cells, since these are fixed between the plates by means of an embedding agent. This fixation method is expensive, however. Above and beyond this, especially under conditions of prolonged exposure, the danger exists that the embedding medium will interact chemically with the embedded cells, possibly destroying the cells. Furthermore, impact loads are transmitted from the surrounding plates via the embedding medium to the photovoltaic cells, possibly causing damage. A further problem is presented by moisture condensation in the cavities, possibly leading to fogging of the panes and thus to a reduction of photovoltaic output and even to destruction of the cells.

Therefore, a need exists to provide an improved photovoltaic element, which is simple to manufacture and protects the cells effectively against chemical or mechanical influences.

SUMMARY OF THE INVENTION

It is an object of the present invention to provide a photovoltaic element that protects the photovoltaic cells against chemical and mechanical influences and is easy to manufacture.

This and other objects have been achieved according to the present invention, the first embodiment of which provides a photovoltaic element, comprising:

two plane or curved plates (1) and (2), which are joined by a circumferential seal (3) at a spacing ranging from 2 to 20 mm, thus forming a cavity (4) in which there are enclosed a plurality of photovoltaic cells (5), each of which is attached to only one of the two plates (2) using an adhesive (6), at least this plate (2) being transparent;

wherein both plates (1) and (2) are made of plastic that is permeable to water vapor and the adhesive with which the photovoltaic cells are attached covers at most 30% of the area of the individual photovoltaic cells.

BRIEF DESCRIPTION OF DRAWINGS

FIG. 1 shows a schematic front view of a photovoltaic element of the present invention with 12 photovoltaic cells. For simplicity, adhesive (6) is shown only for the top left photovoltaic element. Barrier layer (3a) and adhesive layer (3b) are visible through transparent plate (2) resting thereon. Plate (1) is disposed there behind. Conductor tracks (7) and lead (7') are shown purely schematically.

FIG. 2 shows a photovoltaic element of the present invention from the side and in cross section. From this view there can be seen 5 photovoltaic cells (5) with associated adhesive (6) disposed one above the other. Conductor tracks (7) and lead (7') are not shown. Spacer pads (8) are firmly joined only to plate (1).

DETAILED DESCRIPTION OF THE INVENTION

Figure 1:
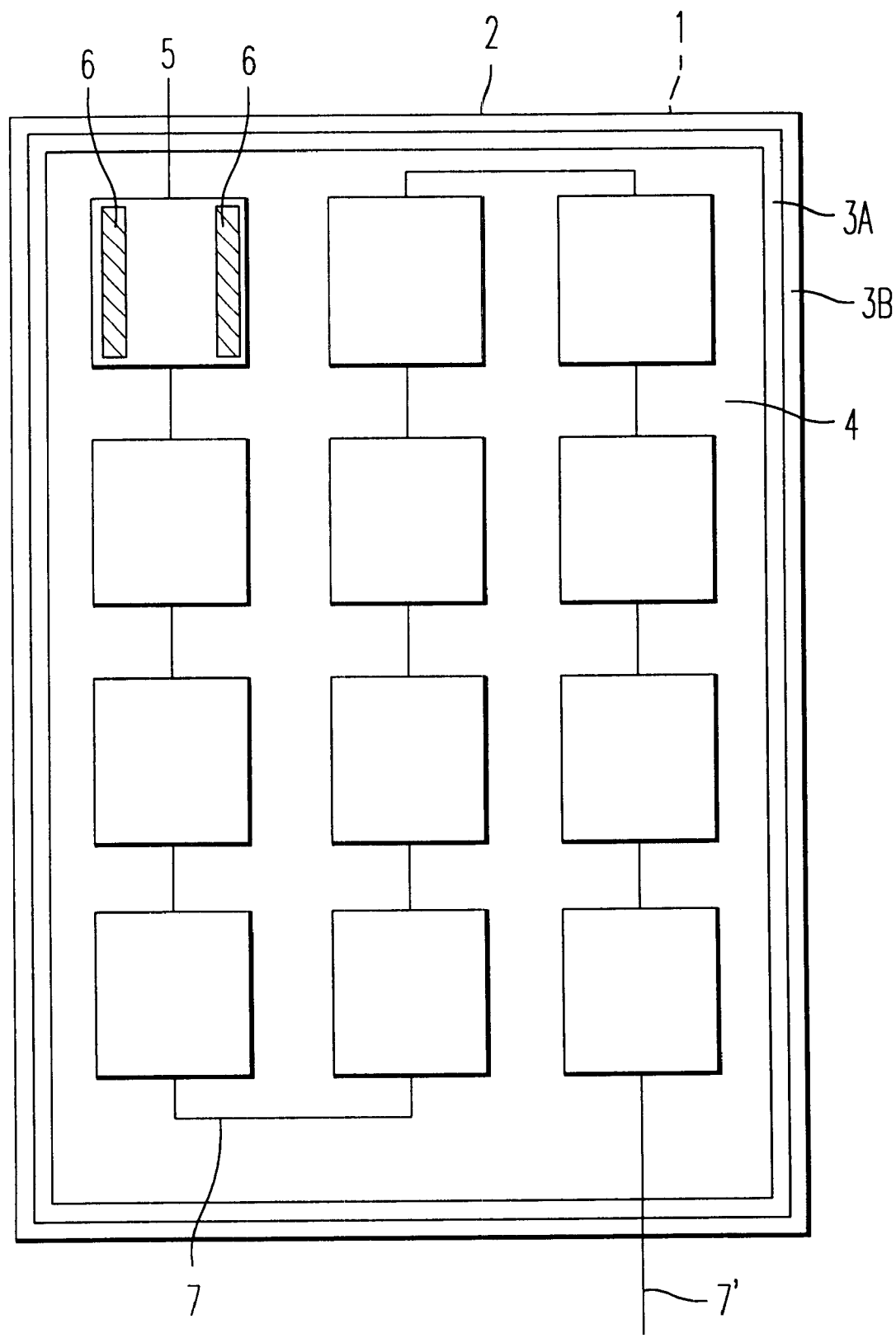
FIGS. 1 and 2 are purely schematic drawings, which are not to scale. They are provided merely for better illustration of the invention and are not to be construed as limitative in any way.
Figure 2:
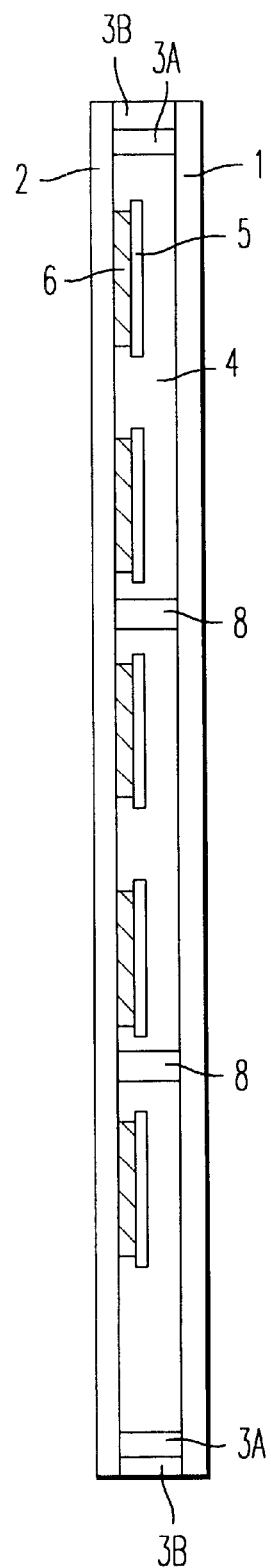

The present invention provides for a photovoltaic element having two planar or curved plates (1) and (2), which are joined by a circumferential seal (3) at a spacing ranging from 2 to 20 mm, thus forming a cavity (4) in which there are enclosed a plurality of photovoltaic cells (5), each of which is attached to only one of the two plates (2) using an adhesive (6). At least the plate (2), to which the photovoltaic cells (5) are attached is transparent. However, both plates can be transparent. Both, plates (1) and (2) are made of plastic that is permeable to water vapor. The adhesive with which the photovoltaic cells are attached covers at most 30% of the area of the individual photovoltaic cells.

The photovoltaic element comprises two planar or curved plates (1) and (2), which are joined by a circumferential seal (3) at a spacing ranging from 2 to 20 mm, preferably 4 to 10 mm, thus forming a cavity (4). The spacing includes all values and subvalues therebetween, especially including 3, 4, 5, 6, 7, 8, 9, 10, 11, 12, 13, 14, 15, 16, 17, 18 and 19 mm.

It is essential to the invention that plates (1) and (2) are made of plastic that is permeable to water vapor. This offers the advantage that little or no moisture condensation can form in cavity (4) of the photovoltaic element, even after relatively long time, and that existing moisture condensation can escape once again.

Within the context of the present invention a plastic that is permeable to water vapor is a plastic with a moisture absorption capacity of at least 0.5%, preferably at least 2%, more preferably at least 5% and most preferably at least 10%. Examples of such plastic include polymethyl methacrylate, polycarbonate, polyester, polystyrene and polyvinyl chloride. A preferred plastic is a cast or extruded polymethyl methacrylate, because of its relatively high moisture absorption capacity of about 2% associated with high transparency and good mechanical characteristics. Polycarbonate is also preferred, since it offers the advantage of relatively high permeability to water vapor.

Plates (1) and (2) can be made of different plastics, but preferably the same plastic material is used.

Plate (1) can be designated as the rear plate which faces away from the light, whereas plate (2) has the function of transmitting the light for the photovoltaic cells. Plate (2) must therefore be sufficiently transparent, which is the case if the light transmission factor (according to DIN 67507) is at least 60%, preferably at least 70%, especially preferably at least 85%.

Preferred plate thicknesses for plate (2) range from 4 to 20 mm, more preferably 4 to 12 mm. The plate thickness includes all values and subvalues therebetween, especially including 5, 6, 7, 8, 9, 10, 11, 12, 13, 14, 15, 16, 17, 18 and 19 mm.

If only one side of the photovoltaic element has to be transparent, plate (1) can be made of less transparent plastic material which, for example, is translucent or colored. Plate (1) may also comprise a plastic member, such as a multiple multiribbed plate which, because of its thickness or its geometry, is not very transparent.

As plate (1) there can be used, for example, a multiribbed plate of polymethyl methacrylate or of polycarbonate. The photovoltaic element can then be used as a thermally insulating roofing or paneling element.

Likewise, there can be used as plate (1) a sound-absorbing wall panel of polymethyl methacrylate, to the entirety or part of which there is attached a plate (2).

The use of polymethyl methacrylate for plates (1) and (2) has in particular the advantage of good deformability. For example, not only planar photovoltaic elements but also curved forms, such as barrel vaults for roofing elements, can be made easily. The deformation can also be applied subsequently by bending of planar elements, preferably in the thermoplastic condition (heat forming). Subsequent bending is also possible with the other cited thermoplastic forms.

Attachment of the Photovoltaic Cells

In cavity (4) there are enclosed a plurality of photovoltaic cells (5), each of which is attached only to plate (2) using an adhesive (6), which covers at most 30%, preferably at most 20%, especially preferably at most 10% of the surface area of the individual photovoltaic cells.

The one-sided bond between the plate (2) and the cells (5) fixes the cells such that impacts on the plates are transmitted only via the adhesive and not over the entire surface, thus reducing the danger of damage due to impact. In order to reduce the impact danger even more, an elastic adhesive is preferably used, such as two-sided adhesive tape comprising a compliant acrylate adhesive. For example, a cell having an area of 10×10 cm can be fixed to one of the two plates with one or two strips having an area of 0.5×5 cm.

Particularly suitable elastic adhesives are acrylate adhesive tapes on the basis of elastic acrylates with relatively high contents, such as 10 to 100 wt %, of ethyl acrylate or butyl acrylate. Optionally a plasticizer can be contained in the acrylate adhesive tape. The amount of the ethyl acrylate or butyl acrylate in the acrylate adhesive tape includes all values and subvalues therebetween, especially including 20, 30, 40, 50, 60, 70, 80 and 90 wt %.

Fixation with a one-sided adhesive bond (6) offers a further advantage. If the adhesive is designed to be attached to the light-absorbing side of the cells, only little of the surface is covered and so the light absorption of the cells is only slightly reduced. This can be the case, for example, when the cells are mounted in a roofing element that is accessible for viewing from the underside. In this case it is advisable to apply the adhesive strips on the roof side facing away from the observer, thus also imparting a more advantageous optical effect, especially since almost all adhesive take on a certain golden appearance in the course of time. A transparent adhesive is preferably used in order to minimize the extent by which the adhesive strips reduce the light absorption of the cells.

The adhesive can be, for example, a double-sided adhesive tape, a glue or a polymeric adhesive.

Photovoltaic Cells

Standard photovoltaic cells (5) have a usually square surface with edge length ranging from about 10 to 15 cm and thickness from 0.5 to 2 mm. The achievable power ranges from 1.3 to 2 watt. The edge length includes all values and subvalues therebetween, especially including 11, 12, 13 and 14 mm. The thickness includes all values and subvalues therebetween, especially including 0.6, 0.7, 0.8, 0.9, 1.0, 1.1, 1.2, 1.3, 1.4, 1.5, 1.6, 1.7, 1.8 and 1.9 mm. The power includes all values and subvalues therebetween, especially including 1.4, 1.5, 1.6, 1.7, 1.8 and 1.9 watt.

As a rule, the cells are disposed side-by-side in square or rectangular arrays comprising, for example, 10×6 cells or similar numbers, with cell-to-cell spacings of 1 to 3 cm. The ratio of the area of the photovoltaic cells to the total area of the photovoltaic elements ranges from 20 to 80, preferably 40 to 60% and most preferably 45–55%.

The individual cells of such arrays are connected together to form electrical units by means of conductor tracks (7), also known as "strings". To collect the electric power or the generated current, at least one lead (7') must be brought out of the photovoltaic element. When the elements are connected in series, it is expedient to bring out one line or cable from each of the first and last elements, respectively.

Dimensions

Plates (1) and (2) enclosing the photovoltaic cells are spaced apart by 1.5 to 6, preferably 2 to 4 mm. The distance includes all values and subvalues therebetween, especially including 2, 2.5, 3, 3.5, 4, 4.5, 5 and 5.5 mm. This distance can be maintained by spacers. It is important that the photovoltaic cells between the plates be enclosed by a circumferential seal. This prevents ingress of moisture into the element.

The Circumferential Seal

The photovoltaic elements are surrounded by means of a circumferential seal (3), through which lead (7') for collecting current can be conveniently brought out. The purpose of circumferential seal (3) is to enclose the elements' water tightly. The circumferential seal can comprise a plurality of layers, especially two layers, in which case an inner layer first acts as a barrier layer (3a) between the photovoltaic cells, thus allowing a polymerization adhesive to be used as the outer layer or adhesive layer (3b), without trapping, in cavity (4), solvent or monomer vapors that may later lead to stress corrosion cracking.

The circumferential seal can be made, for example, of polymethyl methacrylate, polyurethane, EPDM or polysilicone rubber.

Manufacture of the Photovoltaic Elements

The photovoltaic elements are fixed on plate (2) using the adhesive mentioned herein above.

For plane photovoltaic elements the circumferential seal can be installed by, for example, fitting together four rectangular rods (cross section of 10×10 mm, for example, length as needed) of polymethyl methacrylate in the form of a rectangular frame around the photovoltaic elements and, using a suitable solvent, such as methylene chloride, joining them together with plate (2) and with one another by moistening the contact surfaces. It is important that the solvent be allowed to evaporate thoroughly, for a duration of 1 to 4 hours, for example, before plate (1) is placed on the circumferential frame.

If the cavity to be enclosed is large, it may be expedient, in addition to the circumferential seal, to install spacers (8) of the same height at intermediate positions. Such spacers only have to be adhesively bonded to either plate (1) or plate (2), however, in order to maintain tolerance to warping in the element as a whole. As an example, small pads of polymethyl methacrylate can be used.

Plates (1) and (2) can now be permanently sealed outside the barrier layer with an adhesive layer using a circumferential bead. Preferably a viscous polymethyl methacrylate polymerization adhesive is used as adhesive layer. After complete polymerization of the adhesive layer, the photovoltaic element is mechanically stable. The barrier layer, which then is firmly bonded adhesively only to plate (2), nevertheless adequately prevents methyl methacrylate vapors from the polymerization adhesive from entering the cavity during or after polymerization of the adhesive layer, because it bears sealingly on plate (1).

To prevent material stresses, the photovoltaic element can also be subjected to tempering, for example for 2 to 5 hours at 70° C.

The sealing effect can be further improved by applying a small amount of solvent on the upper side of the polymethyl methacrylate frame before plate (1) is placed in position, thus causing slight dissolution of the surface of the polymethyl methacrylate. The small amount of solvent evaporates almost immediately, however, and then plate (1) is placed in position after a short waiting period such as 1 to 5 minutes. As a result, plate (1) bonds adhesively at least slightly to the frame, thus improving the sealing effect or barrier effect.

As an alternative to the polymethyl methacrylate frame described herein above, the circumferential seal can also be made from an elastic material, in which case spacers such as pads of the same plastic material as that of plate (2) are preferably used as well. The spacers can be fixed to plate (2) or also to plate (1) with a solvent adhesive. In this case a circumferential elastic seal is produced, which is somewhat higher than the spacers. Thus, after plate (1) has been placed on the spacers and pressed down on the circumferential seal, a sealed cavity enclosing the photovoltaic elements is formed.

As elastic material for the circumferential seal there can be used a polyurethane adhesive, a polysilicone rubber or a solvent adhesive containing polymer. The latter can be, for example, polymethyl methacrylate in solvent (such as dichloromethane, nitromethane, methyl formate, ethyl formate, methylene chloride), polycarbonate in solvent (tetrahydrofuran), polyvinyl chloride or polystyrene in solvent. For polycarbonate plates, adhesives based on polyurethane in particular are suitable. For polymethyl methacrylate plates, compliant acrylate adhesives such as polyethyl acrylate dissolved in ethyl acetate are most preferred.

Thereafter plates (1) and (2) are firmly joined by a commercial polymerization adhesive. Suitable polymerization adhesives for polymethyl methacrylate are described in, for example, European Patent Application 548740. As a rule, such adhesives contain approximately 30 wt % of polymer (polymethyl methacrylate) dissolved in monomer (methyl methacrylate) as well as one or if necessary more polymerization initiators.

Having generally described this invention, a further understanding can be obtained by reference to certain specific examples which are provided herein for purposes of illustration only, and are not intended to be limiting unless otherwise specified.

EXAMPLE

In a preferred arrangement, a plurality of photovoltaic cells (5), for example an array of 10×10 cells with intermediate spacings of about 1 cm, were fixed on a polymethyl methacrylate plate (2) with a surface area of 150×150 cm and a thickness of 1 cm, using for each two transparent adhesive strips (6) measuring, for example, 0.5×5 cm and comprising double-sided elastic acrylate adhesive tape, the cells being connected by conductor tracks (7). Current-collecting cable (7') of the electric cell assembly was brought out on one side. For the sake of clarity, the outgoing cabling of the first cell is not shown. A plurality of polymethyl methacrylate spacer pads (8) measuring 1×1 cm and having a thickness of 1 mm were attached adhesively by moistening the interface to plate (2) with methylene chloride.

A barrier layer (3a) comprising a compliant acrylate adhesive (polyethyl acrylate dissolved in ethyl acetate) was now applied on the assembly of photovoltaic cells.

After evaporation of the solvent, which was complete about 24 hours after application of barrier layer (3a), second plate (1) of polymethyl methacrylate (3b) was placed in position and the rims are sealed with a polymethyl methacrylate polymerization adhesive (adhesive layer 3b). Under these conditions, adhesive layer (3a) prevents monomer vapors from the polymerization adhesive from entering photovoltaic cells (5).

Thereafter the element was stored for 360 days at 85% relative humidity and 80° C. Neither moisture condensation in the interior nor damage to the photovoltaic cells or to the connecting conductors was observed under these conditions. The element was found to be fully functional after this period.

The priority document of the present application, German patent application 200 02 827.8, filed Feb. 17, 2000, is incorporated herein by reference.

Obviously, numerous modifications and variations on the present invention are possible in light of the above teachings. It is therefore to be understood that within the scope of the appended claims, the invention may be practiced otherwise than as specifically described herein.

What is claimed is:

1. A photovoltaic element, comprising:
   two planar or curved plates, which are joined by a circumferential seal at a spacing ranging from 2 to 20 mm, thus forming a cavity in which there are enclosed a plurality of photovoltaic cells, each of which is attached to only one of said two plates using an adhesive;
   wherein at least the plate to which said photovoltaic cells are attached is transparent;
   wherein said plates comprise a plastic that is permeable to water vapor; and
   wherein said adhesive covers at most 30% of a surface area of each of said photovoltaic cells.

2. The photovoltaic element according to claim 1, wherein said plates independently comprise a plastic selected from the group consisting of polymethyl methacrylate, polycarbonate, polyester, polystyrene and polyvinyl chloride.

3. The photovoltaic element according to claim 1, wherein said circumferential seal comprises a material selected from the group consisting of polymethyl methacrylate, polyurethane, polystyrene, polyvinyl chloride and polysilicone rubber.

4. The photovoltaic element according to claim 3, wherein said circumferential seal comprises a barrier layer and an adhesive layer.

5. The photovoltaic element according to claim 4, wherein said barrier layer is a frame assembled from polymethyl methacrylate pieces and the adhesive layer comprises a polymethyl methacrylate polymerization adhesive.

6. The photovoltaic element according to claim 1, wherein said plates comprise a polycarbonate; and
wherein said circumferential seal comprises a polyurethane.

7. The photovoltaic element according to claim 1, wherein one of said two plates is a sound-absorbing wall panel.

8. The photovoltaic element according to claim 1, wherein one of said two plates is a multi-ribbed plate.

9. The photovoltaic element according to claim 1, wherein said spacing between said two plates is from 4 to 10 mm.

10. The photovoltaic element according to claim 1, wherein said plastic has a moisture absorption capacity of at least 0.5%.

11. The photovoltaic element according to claim 1, wherein said plastic has a moisture absorption capacity of at least 2%.

12. The photovoltaic element according to claim 1, wherein said plastic has a moisture absorption capacity of at least 5%.

13. The photovoltaic element according to claim 1, wherein said plastic has a moisture absorption capacity of at least 10%.

14. The photovoltaic element according to claim 1, wherein one of said plates faces away from light and the other plate transmits the light for the photovoltaic cells.

15. The photovoltaic element according to claim 14, wherein said other plate which transmits the light for the photovoltaic cells has a transmission factor of at least 60%.

16. The photovoltaic element according to claim 14, wherein said other plate which transmits the light for the photovoltaic cells has a transmission factor of at least 67%.

17. The photovoltaic element according to claim 14, wherein said other plate which transmits the light for the photovoltaic cells has a transmission factor of at least 85%.

18. The photovoltaic element according to claim 1, wherein said adhesive covers at most 20% of the surface area of each of said photovoltaic cells.

19. The photovoltaic element according to claim 1, wherein said adhesive covers at most 10% of the surface area of each of said photovoltaic cells.

20. The photovoltaic element according to claim 1, wherein said adhesive is an acrylate adhesive tape comprising 10 to 100 wt % of ethyl acrylate or butyl acrylate.

21. The photovoltaic element according to claim 1, wherein said adhesive is adhering on one side.

22. The photovoltaic element according to claim 1, wherein said photovoltaic cells have an edge length of from 10 to 15 cm and a thickness of from 0.5 to 2 mm.

23. The photovoltaic element according to claim 1, wherein a power of said photovoltaic cells is from 1.3 to 2 watt.

24. The photovoltaic element according to claim 1, wherein a cell spacing between said photovoltaic cells is from 1 to 3 cm.

25. The photovoltaic element according to claim 1, wherein a ratio of an area of said photovoltaic cells to an area of said photovoltaic element is from 20 to 80%.

26. The photovoltaic element according to claim 1, wherein a ratio of an area of said photovoltaic cells to an area of said photovoltaic element is from 40 to 60%.

27. The photovoltaic element according to claim 1, further comprising at least one lead.

28. The photovoltaic element according to claim 1, wherein a spacing between said plates is from 2 to 6 mm.

29. The photovoltaic element according to claim 1, wherein a spacing between said plates is from 2 to 4 mm.

30. A method of making a photovoltaic element, comprising:
fixing a plurality of photovoltaic cells on the same surface of a first plate using an adhesive;
connecting said photovoltaic cells by a conductor track;
attaching a current collecting cable to at least one of said photovoltaic cells;
attaching a plurality of spacer pads to said surface of said first plate having said photovoltaic cells or to the same surface of a second plate;
placing said second plate on top of said surface of said first plate having said photovoltaic cells, thereby forming a gap between said first and said second plate; and
sealing the gap with an adhesive, thereby forming a sealed cavity enclosing said photovoltaic cells;
wherein said first and said second plate independently comprise a plastic selected from the group consisting of polymethyl methacrylate, polycarbonate, polyester, polystyrene and polyvinyl chloride.

31. The method of claim 30, wherein said first plate comprises polymethyl methacrylate.

32. The method of claim 30, wherein said first plate has a surface area of 150×150 cm and a thickness of 1 cm.

33. The method of claim 30, wherein said adhesive is a double sided elastic adhesive tape.

34. The method of claim 30, wherein said spacer pads comprise polymethyl methacrylate.

35. The method of claim 30, wherein said second plate comprises polymethyl methacrylate.

36. The method of claim 30, wherein said second plate is a sound-absorbing wall panel.

37. The method of claim 30, wherein said second plate is a multi-ribbed plate.

38. The method of claim 30, wherein said gap is from 4 to 10 mm.

39. The method of claim 30, wherein said plastic has a moisture absorption capacity of at least 0.5%.

40. The method of claim 30, wherein said plastic has a moisture absorption capacity of at least 2%.

41. The method of claim 30, wherein said plastic has a moisture absorption capacity of at least 5%.

42. The method of claim 30, wherein said plastic has a moisture absorption capacity of at least 10%.

43. The method of claim 30, wherein said first plate transmits light for the photovoltaic cells.

44. The method of claim 30, wherein said first plate has a transmission factor of at least 60%.

45. The method of claim 30, wherein said first plate has a transmission factor of at least 67%.

46. The method of claim 30, wherein said first plate has a transmission factor of at least 85%.

47. The method of claim 30, wherein said adhesive covers at most 20% of the surface area of each of said photovoltaic cells.

48. The method of claim 30, wherein said adhesive covers at most 10% of the surface area of each of said photovoltaic cells.

49. The method of claim 30, wherein said adhesive is an acrylate adhesive tape comprising 10 to 100 wt % of ethyl acrylate or butyl acrylate.

50. The method of claim 30, wherein said photovoltaic cells have an edge length of from 10 to 15 cm and a thickness of from 0.5 to 2 mm.

51. The method of claim 30, wherein a power of said photovoltaic cells is from 1.3 to 2 watt.

52. The method of claim 30, wherein a cell spacing between said photovoltaic cells is from 1 to 3 cm.

53. The method of claim 30, wherein said gap is from 1.5 to 6 mm.

54. The photovoltaic element according to claim 1 obtained by a method, comprising:

fixing the plurality of photovoltaic cells on the same surface of one of the two plates using the adhesive;

connecting said photovoltaic cells by a conductor track;

attaching a current collecting cable to at least one of said photovoltaic cells;

attaching a plurality of spacer pads to said surface of one of the two plates having said photovoltaic cells or to the same surface of the other of the two plates;

placing said other of the two plates on top of said surface of said one of the two plates having said photovoltaic cells, thereby forming a gap between said two plates; and sealing the gap with the adhesive, thereby forming a sealed cavity enclosing said photovoltaic cells.

* * * * *